United States Patent [19]

Krulik

[11] Patent Number: 4,698,124

[45] Date of Patent: Oct. 6, 1987

[54] METHOD OF REGENERATING PERMANGANATE ETCH BATH

[75] Inventor: Gerald Krulik, Laguna Hills, Calif.

[73] Assignee: Morton Thiokol, Inc., Chicago, Ill.

[21] Appl. No.: 879,762

[22] Filed: Jun. 27, 1986

Related U.S. Application Data

[63] Continuation of Ser. No. 740,129, May 31, 1985, abandoned.

[51] Int. Cl.$^4$ .................... B44C 1/22; B29C 37/00; C23F 1/00; C03C 15/00
[52] U.S. Cl. .................................... 156/642; 134/10; 156/626; 156/644; 156/655; 156/656; 156/666; 156/668; 156/902; 252/79.5
[58] Field of Search ............... 156/626, 640, 642, 655, 156/656, 659.1, 666, 668, 345, 901, 902, 644; 252/79.1, 79.2, 79.5; 134/10, 13

[56] References Cited

U.S. PATENT DOCUMENTS 4,592,852  6/1986  Courduvelis et al. .......... 156/642 X
4,629,636  12/1986  Courduvelis et al. .............. 427/444

FOREIGN PATENT DOCUMENTS 57-55933  4/1982  Japan .

OTHER PUBLICATIONS

Latimer, W. M., The Oxidation States of the Elements and Their Potentials in Aqueous Solutions, 2nd Ed., 1961, pp. 78, 79 and 340–348.
Cotton and Wilkinson, Advanced Inorganic Chemistry—A Comprehensive Text, 1962, pp. 428 and 429.

Primary Examiner—William A. Powell
Attorney, Agent, or Firm—Richard J. Sheridan; Gerald K. White

[57] ABSTRACT

A method is provided for regenerating the spent permanganate ions in an alkaline permanganate-containing etchant composition by adding to the composition an oxidizer selected from the group consisting of an inorganic bromate, hypochlorite, chlorite, chlorate, peroxydisulfate, monopersulfate and mixtures thereof.

4 Claims, 6 Drawing Figures

METHOD OF REGENERATING PERMANGANATE ETCH BATH

This is a continuation of application Ser. No. 740,129, filed May 31, 1985 and now abandoned.

BACKGROUND OF THE INVENTION

1. Field of the Invention

This invention relates to a method for regenerating the spent permanganate ions in a permanganate etch bath by adding to the bath an oxidizer selected from inorganic bromate, hypochlorite, chlorite, chlorate, peroxydisulfate, monopersulfate or mixtures thereof.

2. Description of the Prior Art

Hole forming operations in resin containing materials often result in the smearing of resin over the interior wall or barrel of a hole. This resin smear is primarily attributable to the generation or utilization of temperatures exceeding the melting point of a resinous component of the material during the hole forming process.

In many applications, for instance in the manufacture of printed circuit boards, it is essential that the resin smeared on the interior wall of the hole be completely removed. The process of removing these resin deposits is known as "desmearing" and has been accomplished with varying success by a number of techniques. One such technique is to treat the material to be desmeared with a permanganate solution.

Permanganate desmearing solutions and processes are well known. These solutions, for the most part, employ potassium permanganate (KMnO$_4$) and a caustic alkali metal hydroxide. They can vary considerably in both permanganate and caustic concentration.

Examples of such permanganate solutions include those in U.S. Pat. No. 1,969,678, issued Aug. 7, 1934 to White et al. which discloses etching solutions, e.g. copper, which contain ferric chloride and an oxidizer which converts ferrous ions to ferric ions. This oxidizer may be KMnO$_4$. Of course, these etching solutions would have at best limited utility in preparing circuit boards since the boards often contain a copper layer which would be subject to removal by the ferric chloride.

U.S. Pat. No. 3,293,148, issued Dec. 20, 1966 to Dell et al., discloses a cleaning solution for metals which contains an oxidizer, alkali metal hydroxide, gluconic acid and polyethylene glycol. Among the many oxidizers disclosed are permanganates, although they are not preferred and no example is given employing them.

U.S. Pat. No. 3,425,947, issued Feb. 4, 1969 to Rausch et al., relates to solid concentrates useful in preparing treatment baths for removing organic substances from metal surfaces. The concentrates contain about 50-90% alkali metal hydroxide, 10-50% permanganate and 1 gram equivalent/gram mole of permanganate of a reducing agent. Typical solutions prepared by the solid concentrates contain about 105 g/l of KMnO$_4$ and about 250 g/l NaOH.

U.S. Pat. No. 3,457,107, issued July 22, 1969 to Mickelson et al., discloses compositions for chemically polishing stainless steel. These compositions are aqueous solutions containing alkali metal hydroxides, e.g. NaOH, and alkali metal permanganate, e.g. KMnO$_4$. Typical solutions contain about 39 g/l NaOH, 16 g/l KMnO$_4$ and 4.8 g/l Na$_2$CO$_3$; or 78 g/l NaOH, 32 g/l KMnO$_4$ and 9.6 g/l Na$_2$CO$_3$.

U.S. Pat. No. 3,489,625, issued Jan. 13, 1970 to Dell et al., discloses acid pickling of carbon steel followed by treatment with an alkaline permanganate solution. The alkaline permanganate solution contains about 5-50 g/l KMnO$_4$ and about 10-200 g/l alkali metal hydroxide.

U.S. Pat. No. 3,506,397, issued Apr. 14, 1970 to Vincent et al., relates to the treatment of ABS resin with a composition containing phosphoric acid and potassium permanganate.

U.S. Pat. Nos. 3,598,630 and 3,647,699, issued respectively on Aug. 10, 1971 and Mar. 7, 1972 to Doty et al., are also related to phosphoric acid/potassium permanganate solutions for treating ABS polymers.

U.S. Pat. No. 3,625,758, issued Dec. 7, 1971 to stahl et al., deals with the manufacture of printed circuit boards. As one step in the manufacturing process, the board is treated with an oxidization and degradating agent which may be a permanganate solution. However, no details or specific examples regarding the composition of the permanganate solution are provided.

U.S. Pat. No. 3,652,351, issued Mar. 28, 1972 to Guisti, discloses compositions for etching synthetic polymers. These etchant compositions contain 2.5-8.5% potassium and/or sodium manganate, 30-70% sodium and/or potassium hydroxide and 21.5-67.5% water. These compositions are prepared from the corresponding permanganate which is reacted with a large amount of sodium and/or potassium hydroxide at elevated temperature to reduce the permanganate to manganate. For instance, in Example 1 Guisti combines 50 g KOH, 5 g KMnO$_4$ and 20 g water and heats the resulting mixture at 80°-90° C. until the deoxidation reaction is complete. Likewise, in Example 2 the reaction mixture contains 45 g NaOH, 6 g NaMnO$_4$ and 20 g water, and Example 3 employs 25 g NaOH, 25 g KMnO$_4$, 2.5 g NaMnO$_4$ and 20 g water.

U.S. Pat. No. 3,833,414, issued Sept. 3, 1974 to Grisik et al., discloses a method for removal of aluminide coatings from metal by treating the metal with a mixed acid solution, followed by treatment with an alkaline permanganate aqueous solution, and finally a second treatment with the mixed acid. The alkaline permanganate aqueous solution contains 8-11% NaOH, 8-11% Na$_2$CO$_3$ and 4-6% KMnO$_4$.

U.S. Pat. Nos. 4,042,729; 4,054,693 and 4,073,740 issued respectively on Aug. 16, 1977; Oct. 18, 1977 and Feb. 14, 1978 to Polichette et al., relate to treating resinous surfaces with a solution of manganate (MnO$_4{}^{2-}$) and permangante (MnO$_4{}^-$) where the molar ratio of manganate/permanganate is up to 1.2 and the pH of the solution is 11-13. Polichette et al. teach that higher pH increases the MnO$_4{}^{2-}$/MnO$_4{}^-$ ratio, which is undesirable.

U.S. Pat. No. 4,294,651, issued Oct. 13, 1981 to Ohmura, discloses etching of a semiconductor substrate with a composition containing a fluorine compound (7-38%), an oxidizing agent such as KMnO$_4$ (2.5-7%) and alkali such as KOH or NaOH (1-10%).

U.S. Pat. No. 4,425,380, issued Jan. 10, 1984 to Duffy et al., discloses a process for removing resin smear (desmearing) from a interior wall of a hole in a resinous substrate. The process involves contacting the substrate with an alkaline permanganate solution, having a pH between 11 and 13, at elevated temperature. With regard to the permanganate, it is stated that any metal salt of permanganic acid which is stable and soluble to the extent of at least 10 g/l in water can be employed, sodium permanganate and potassium permanganate being preferred. While it is disclosed that amounts from about 10 g/l up to the limit of solubility of permanganate may be employed, it is emphasized that especially good results are obtained with NaMnO$_4$ or KMnO$_4$ in the range of 10-60 g/l. Further, it is taught that the rate of bonding sites formation increases up to about 60 g/l, but no further increases in rate is noted above this level. Thus, Duffy et al. place a practical upper limit of 60 g/l of permanganate on their desmearing solutions.

U.S. Pat. No. 4,430,154, issued Feb. 7, 1984 to Stahl et al., relates to a method for removing an adhesive medium from printed circuit boards without corroding the base material or copper conductor on the board by treatment with an alkaline permanganate or chromic acid solution. The alkaline permanganate solution disclosed contains 50 g/l KMnO$_4$ and 50 g/l NaOH.

British Pat. No. 1,479,558 of Kollmorgen Corporation, published on July 13, 1977, also relates to desmearing and etchback of printed circuit boards and wire conductors by treatment with an alkaline permanganate solution containing potassium permanganate, a strong base (e.g. NaOH) and a fluorinated hydrocarbon wetting agent. The solution contains about 10-75 g/l KMnO$_4$ and enough NaOH to achieve a pH of 13-14. Typically, about 40 g/l of NaOH is employed. The desmearing process is conducted at temperatures from about 35°-50° C., it being disclosed that temperatures above 70° C. result in increased permanganate demand in order to maintain the bath composition without yielding any apparent advantage, i.e. the overall process becomes less efficient in terms of permanganate consumption.

One of the problems encountered with permanganate etch baths involves the conversion of permanganate ion to a manganese species having a lower oxidation state, e.g. manganate, which species have no activity for desmearing or etching. This conversion can occur as a result of the etching or desmearing process or even spontaneously. For example, in the presence of high amounts of caustic, as is often found in permanganate etch baths, permanganate undergoes a disproportionation reaction to manganate. Also, MnO$_2$ precipitates, which can be formed from further disproportionation of manganate and from the oxidation of organic material, catalyze this decomposition of permanganate. The result is that the useful life of the permanganate etch bath is shortened appreciably. In order to maintain a useful etch bath, the permanganate content of the spent or partially spent bath must be replenished (i.e. add new permanganate to the bath) or the bath replaced entirely with a fresh permanganate solution.

It has now been discovered that a number of sulfur and halide containing strong oxidants can be used to slowly or rapidly regenerate a high caustic permanganate etch bath, thereby obviating the necessity of replenishing or replacing the bath. These materials may be added to the bath continuously or intermittently. These regenerants thus make a high caustic or low caustic, high permanganate bath much more economical to operate. Indeed, in some cases the life of the bath is essentially limitless.

SUMMARY OF THE INVENTION

In accordance with the present invention, there is provided a method for regenerating the spent permanganate ions in a permanganate-containing etchant composition said method comprising adding to the composition, in an amount sufficient to oxidize essentially all of the non-permanganate, manganese-containing species in the composition to permanganate, an oxidizer selected from the group consisting of an inorganic bromate, hypochlorite, chlorite, chlorate, peroxydisulfate, monopersulfate and mixtures thereof.

DETAILED DESCRIPTION OF THE PREFERRED EMBODIMENTS

Figure 1:
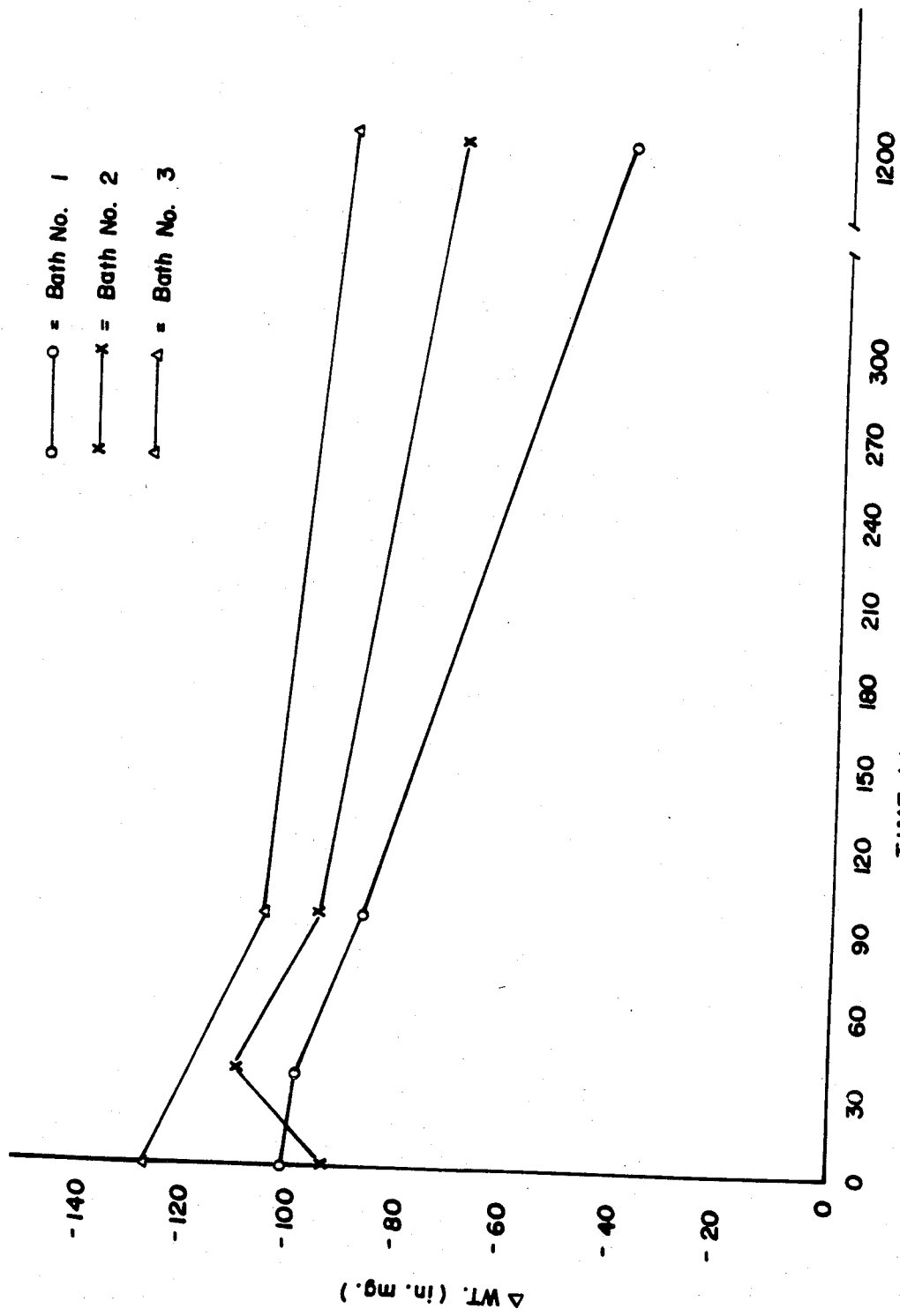
FIG. 1 is a graphical representation of the data presented in Example 4 showing $\Delta Wt$ plotted against time.

The process of the present invention relates to a method for regenerating permanganate etchant compositions in which some or all of the permanganate ions have been "spent", i.e. converted to manganese-containing species or ions other than permanganate. As used herein the term "regenerate" refers to the conversion of manganese-containing species or ions other than permanganate to permanganate. The conversion of non-permanganate species to permanganate is accomplished by adding to the composition containing such non-permanganate species an oxidizer compound of this invention in an amount sufficient to convert substantially all of the non-permanganate, manganese-containing species to permanganate. The oxidizers which are useful in the practice of this invention are selected from inorganic bromates, hypochlorites, chlorites, chlorates, peroxydisulfates, monopersulfates and mixtures thereof. These inorganic oxidizers can have cations selected from Na$^+$, K$^+$, Cs$^+$, Rb$^+$, Ca$^+$, and the like. However, the choice of cation may be dictated by the particular permanganate etchant composition to be regenerated. For example, for those etchant compositions wherein the primary source of permanganate is NaMnO$_4$ it is generally undesirable to introduce an excess of K$^+$ ions into the composition since the presence of the K$^+$ ions will depress the solubility of the NaMnO$_4$. However, the converse is not true for etchant solutions composed primarily of KMnO$_4$. Since the solubility of the KMnO$_4$ is not affected appreciably by the presence of Na$^+$, inorganic oxidizers containing Na$^+$ may be used in KMnO$_4$ etchants. Because Na$^+$ can be used without detriment in both NaMnO$_4$ and KMnO$_4$ solutions, it is the preferred cation for the oxidizers of this invention.

It should be emphasized that not all strong oxidizers were found to be useful in the practice of this invention. To be effective, useful oxidizers must be capable of oxidizing the non-permanganate, manganese-containing species in the spent bath to permanganate in a medium which is alkaline (often highly alkaline) due to the presence of, e.g., NaOH in the bath. Furthermore, it was discovered that it was not sufficient merely to consult a standard redox table in order to determine which oxidizers would be useful in this invention. For instance, oxidizers such as peroxides and hydroxylamine would, from the redox table data, be expected to be operative in the present invention. However, they were found to be inoperative. Also, several oxidizers which might be capable of oxidizing manganese-containing species to permanganate were not compatible with the permanganate etch bath or had safety/toxicity problems. Finally, some of the oxidizers useful in this invention, especially the preferred peroxydisulfate and monopersulfate compounds, would not be expected to perform adequately based on the data from standard reference works. Thus, it is believed that their utility in this invention, and especially their superiority over the other oxidizers useful in this invention, is highly unobvious.

The oxidizers of the present invention are all useful in regenerating permanganate solutions, although they may vary in the rate at which they do so. For example, inorganic bromates are relatively slow in regenerating permanganate and, therefore, it may be necessary, depending upon the amount of permanganate to be regenerated, to use the bromate in highly concentrated form and/or to employ it only when relatively small amounts of non-permanganate species are to be regenerated to permanganate. On the other hand, peroxydisulfate and monopersulfate rapidly convert non-permanganate species, e.g. $MnO_4^{2-}$ (manganate) $MnO_2$ (manganese IV dioxide) and $Mn^{2+}$ (manganous ion), to permanganate. They are very efficacious and with them the permanganate etchant bath can be maintained readily. The hypochlorites, chlorites and chlorates perform better than the bromates but are not as efficient as the peroxydisulfates and monopersulfates.

It has been quite unexpectedly discovered that the oxidizers of the present invention not only regenerate permanganate, but do so in the absence of a catalyst. It was believed that the oxidation reaction involved in the regeneration of the permanganate would require a catalyst, e.g. $AgNO_3$, when peroxydisulfates and monopersulfates were used. However, these oxidizers were found to regenerate spent baths rapidly without any catalyst present.

The amount of oxidizer added to the spent permanganate bath can vary considerably depending upon several factors. For example, a spent bath which contains primarily manganese species in a very low oxidation state (e.g. species such as $MnO_2$ or Mn(II) will require a greater amount of oxidizer than a bath which contains manganese species primarily of an intermediate oxidation state (e.g. manganate). Also, the amount of oxidizer required will vary with the particular oxidizer employed, the desired speed of regeneration, bath temperature, permanganate concentration (in the original and/or spent bath), alkalinity of the bath and the like. Thus, quantifying a useful amount of oxidizer for all cases is extremely difficult. In general, however, the amount of oxidizer required is that amount which is sufficient to convert essentially all of the non-permanganate, manganese species in the spent bath to permanganate. In practice, this amount can be quite readily determined by a variety of techniques. For example, the original bath will contain a known amount of permanganate. The spent bath can be analyzed for its remaining permanganate content (as by titration) and the amount of oxidizer required determined therefrom. An even easier method is provided by the inherent color change which the permanganate bath undergoes as it is depleted. Baths containing undepleted permanganate are purple in color, whereas a completely spent bath is green. Thus, when the bath begins to change to a green color (or, if desired, when it has changed to a green color altogether), the oxidizer can be added to the bath until it returns to its original, purple color. If desired, the color change can be monitored via visible spectroscopy, using a few drops of the bath in a concentrated caustic solution. This method is preferred as even small amounts of manganate can be readily seen and sufficient regnerator added to convert it back to permanganate. Yet another way of determining when sufficient oxidizer has been added to the bath to effect full regeneration is to monitor the presence of $MnO_2$ precipitates in the bath. Since these precipitates are more difficult to convert to permanganate than is manganate, when the precipicates disappear any manganate ions in the bath should be converted to permanganate as well, and the bath should be fully regenerated.

It should also be noted that the oxidizer is preferably added to the bath in an amount which is in excess of that required to regenerate the bath. Excess oxidizer in the bath does not adversely affect etch efficiency and allows for some margin of error in the amount of oxidizer used. Use of an excess of oxidizer also allows some compensation for slower speed of regeneration with certain oxidizers, notably the oxidized halide species.

The process of this invention may be carried out either continuously or as a batch process. In other words, the bath may be maintained in an essentially constantly regenerated state by the periodic addition of oxidizer as the bath is used, or the bath can be allowed to deplete to the point where etch efficiency drops below a useful level and then the oxidizer can be added in a single, large dosage to regenerate the bath. Since the continuous, or periodic method permits the bath to be used without interruption, and allows regeneration even while the bath is actually being used to etch material, it is the preferred embodiment of this invention. This is especially true for those oxidizers of this invention which are relatively slow in regenerating permanganate. By adding the oxidizer continuously or periodically to the bath an excess of oxidizer will always be present in the bath, so the permanganate content is always maintained at a high level. Thus, relatively small amounts of non-permanganate, manganese species need to be oxidized at any given time. Therefore, even though the oxidizer may be a relatively slow regenerator, regeneration time is kept to a minimum.

The present invention will now be further described in the following examples.

EXAMPLE 1

A spent solution which originally contained about 160 g/l $NaMnO_4$ and 100 g/l NaOH was a pure green color, and was diluted with water to make 250 ml of solution. The solution was then heated to 120° F. Approximately 20 g of $Na_2S_2O_8$ was added to the hot, green solution with stirring. No catalyst was added. In less than about 2 minutes oxygen was being rapidly evolved from the solution and the solution had turned a pink/purple color, indicating that permanganate had been regenerated in the solution.

EXAMPLE 2

To a beaker containing 100 ml of the spent solution employed in Example 1 was added about 30 g of $Na_2S_2O_8$ at room temperature. Within about 3 or 4 minutes the solution changed color completely from its original pure green color to purple, indicating that the manganese species in the spent (green) solution had been converted to permanganate (purple). Also, no $MnO_2$ precipitates were found in the bottom of the beaker

EXAMPLE 3

To 250 ml of the completely green, spent permanganate solution used in Example 1 was added a small amount of Oxone TM potassium monopersulfate (a triple salt of $KHSO_4$, $K_2SO_4$ and $2KHSO_5$ sold by E. I. duPont Co.) at room temperature. The solution immediately began to turn purple, and after about 5 minutes the entire 250 ml was completely converted to permanganate.

The following examples demonstrate the ability of a hypochlorite (NaOCl) to extend the useful life of a permanganate etch bath by the essentially constant regeneration of permanganate in the bath.

EXAMPLES 4-9

Permanganate baths were prepared by adding the following ingredients to water to make 1 liter of the bath:

| Bath No. | grams of 40% aqueous sol'n of $NaMnO_4$ | ml of a 400 g/l aqueous sol'n of NaOH | grams of 10 g/l aqueous sol'n of NaOCl |
|---|---|---|---|
| 1 | 400 g* | 100 ml | 0 |
| 2 | 400 g | 100 ml | 95 |
| 3 | 400 g | 100 ml | 195 |

*Represents 160 g/l of $NaMnO_4$ in 1 liter of bath solution.

Each of Baths No. 1, 2 and 3 was then tested for etch performance over a period of time according to the following procedure:

1. A circuit board having copper clad on both sides of an epoxy resin/fiber glass substrate is cut to a $3'' \times 3''$ size.
2. The copper is etched completely from both sides of the board using a standard copper etching bath, e.g. a $H_2O_2/H_2SO_4$ solution.
3. The resulting board is baked at 100° C. until completely dry and then weighed.
4. The board is then placed in the bath to be tested at 175° F. for 15 minutes.
5. The board is removed from the bath and placed in an acid neutralization solution.
6. The board is removed from the neutralizer, baked at 100° C. until completely dry and weighed again.
7. Total weight loss is determined by comparing the weight of the board at step 3 and step 6. The change in weight is indicated in the following examples as "Δwt" and indicates the amount of material etched from the board by the bath.
8. The bath is maintained at 170° F. for the period of time indicated in the examples and steps 1-7 are repeated with new boards.

The above procedure is repeated several times over varying periods of time as indicated in the examples.

EXAMPLE 4

| Time (in minutes)* | Δ Wt (in mg.) | |
|---|---|---|
| | BATH NO. 1 | |
| 0 | −101.0 | |
| 45 | −99.8 | average Δ Wt = 82.5 |
| 95 | −86.8 | |
| 1200 | −42.4 | |
| | BATH NO. 2 | |
| 0 | −94.2 | |
| 45 | −110.3 | |
| 95 | −95.8 | average Δ Wt = 93.4 |
| 1200 | −73.4 | |
| | BATH NO. 3 | |
| 0 | −127.9 | |
| 45 | −46.0** | average Δ Wt = 109.5 |
| 95 | −106.7 | |
| 1200 | −94.0 | |

*The time indicated in all examples is the time elapsed from the introduction of the first board into the bath.
**This abnormally low Δ wt is believed to be due to an error in the test procedure, e.g. a weighing error or mix-up of test panels. Therefore, this Δ wt is not used to calculate the average.

The data for Example 4 is also presented graphically in FIG. 1 where ΔWt is plotted against time. The ΔWt measurement at 45 minutes for Bath No. 3 has not been included in the graph as it is believed to be in error.

EXAMPLE 5

| Time (in minutes) | Δ Wt (in mg.) | |
|---|---|---|
| | BATH NO. 1 | |
| 0 | −42.4 | |
| 45 | −59.7 | |
| 90 | −26.6 | average Δ Wt = −39.0 |
| 120 | −26.9 | |
| 165 | −41.1 | |
| 270 | −37.0 | |
| | BATH NO. 2 | |
| 0 | −73.4 | |
| 45 | −47.5 | |
| 90 | −59.0 | average Δ Wt = −54.1 |
| 120 | −35.8 | |
| 165 | −61.4 | |
| 270 | −47.7 | |
| | BATH NO. 3 | |
| 0 | −94.0 | |
| 45 | −65.9 | |
| 90 | −55.3 | average Δ Wt = −60.4 |
| 120 | −53.4 | |
| 165 | −38.9 | |
| 270 | −54.9 | |

Figure 2:
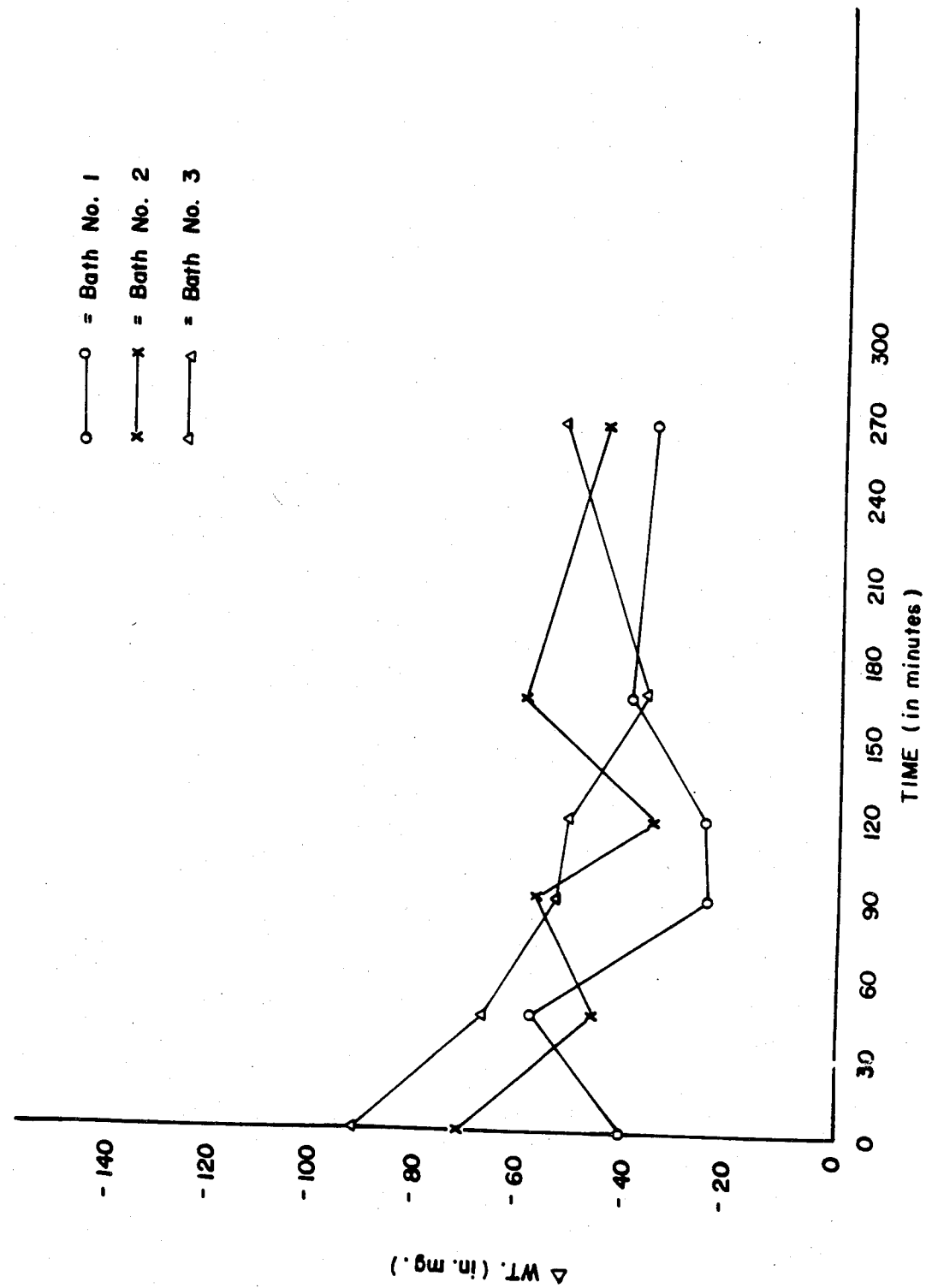
FIG. 2 is a graphical representation of the data presented in Example 5, showing $\Delta Wt$ plotted against time.

The data for Example 5 is also presented graphically in FIG. 2 where Δwt is plotted against time.

EXAMPLE 6

| Time (in minutes) | Δ Wt (in mg.) | |
|---|---|---|
| | BATH NO. 1 | |
| 0 | −20.8 | |
| 90 | −15.1 | average Δ Wt = −20.0 |
| 135 | −23.6 | |
| 180 | −20.5 | |
| | BATH NO. 2 | |
| 0 | −28.9 | |
| 90 | −25.2 | average Δ Wt = −25.1 |
| 135 | −30.7 | |
| 180 | −15.7 | |
| | BATH NO. 3 | |
| 0 | −34.8 | |
| 90 | −29.4 | average Δ Wt = −30.7 |
| 135 | −26.9 | |
| 180 | −31.8 | |

Figure 3:
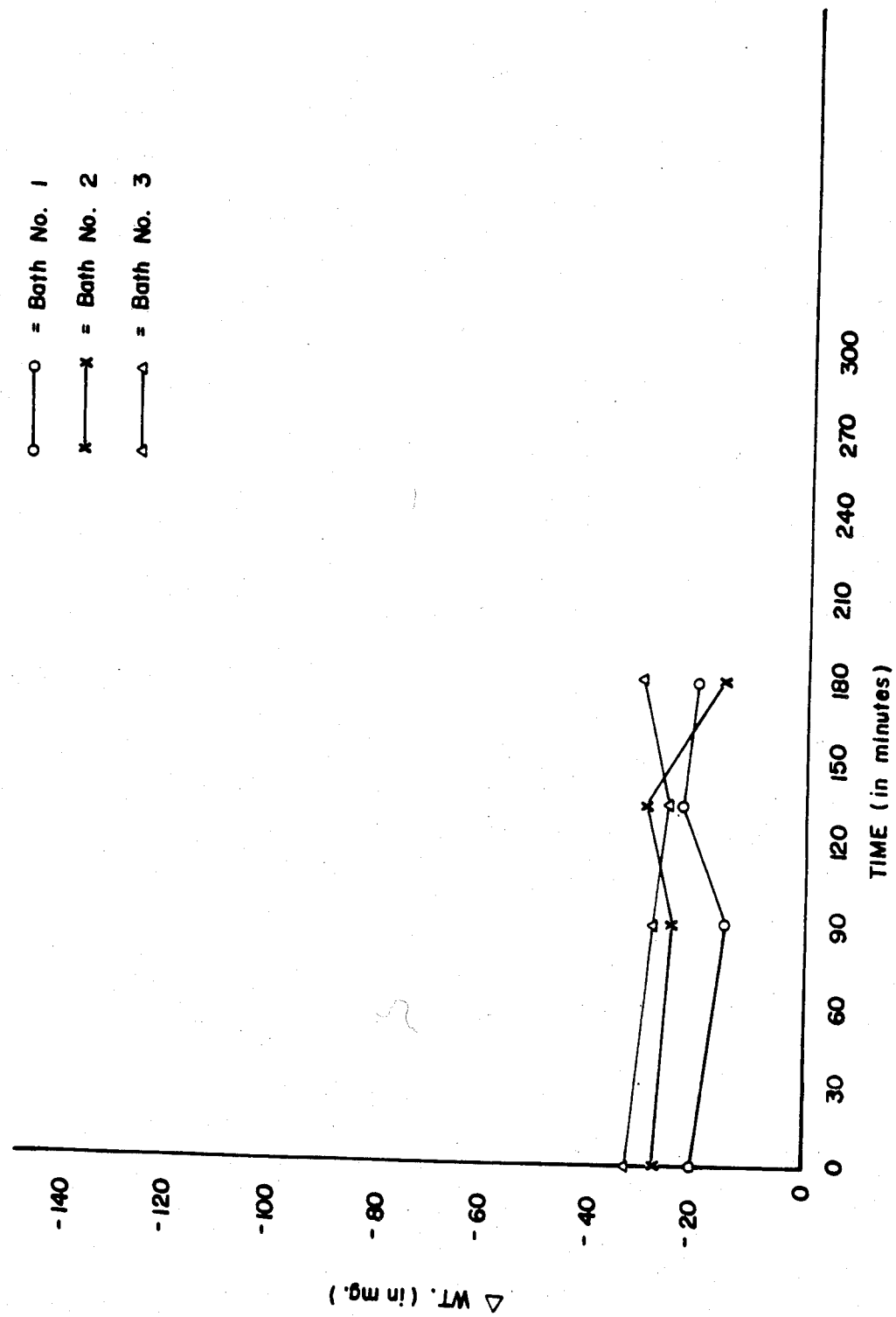
FIG. 3 is a graphical representation of the data presented in Example 6, showing $\Delta Wt$ plotted against time.

The data from example 6 is also presented graphically in FIG. 3 where ΔWt is plotted against time.

EXAMPLES 7–9

These examples were conducted in the same manner as Examples 4–6 except that the boards were etched in the bath for only 5 minutes.

EXAMPLE 7

| Time (in minutes) | Δ Wt (in mg.) | |
|---|---|---|
| BATH NO. 1 | | |
| 0 | −41.5 | |
| 45 | −39.8 | average Δ Wt = −39.2 |
| 95 | −36.4 | |
| BATH NO. 2 | | |
| 0 | −45.1 | |
| 45 | −56.3 | average Δ Wt = −49.3 |
| 95 | −46.6 | |
| BATH NO. 3 | | |
| 0 | −32.3 | |
| 45 | −60.6 | average Δ Wt = −46.6 |
| 95 | −47.0 | |

Figure 4:
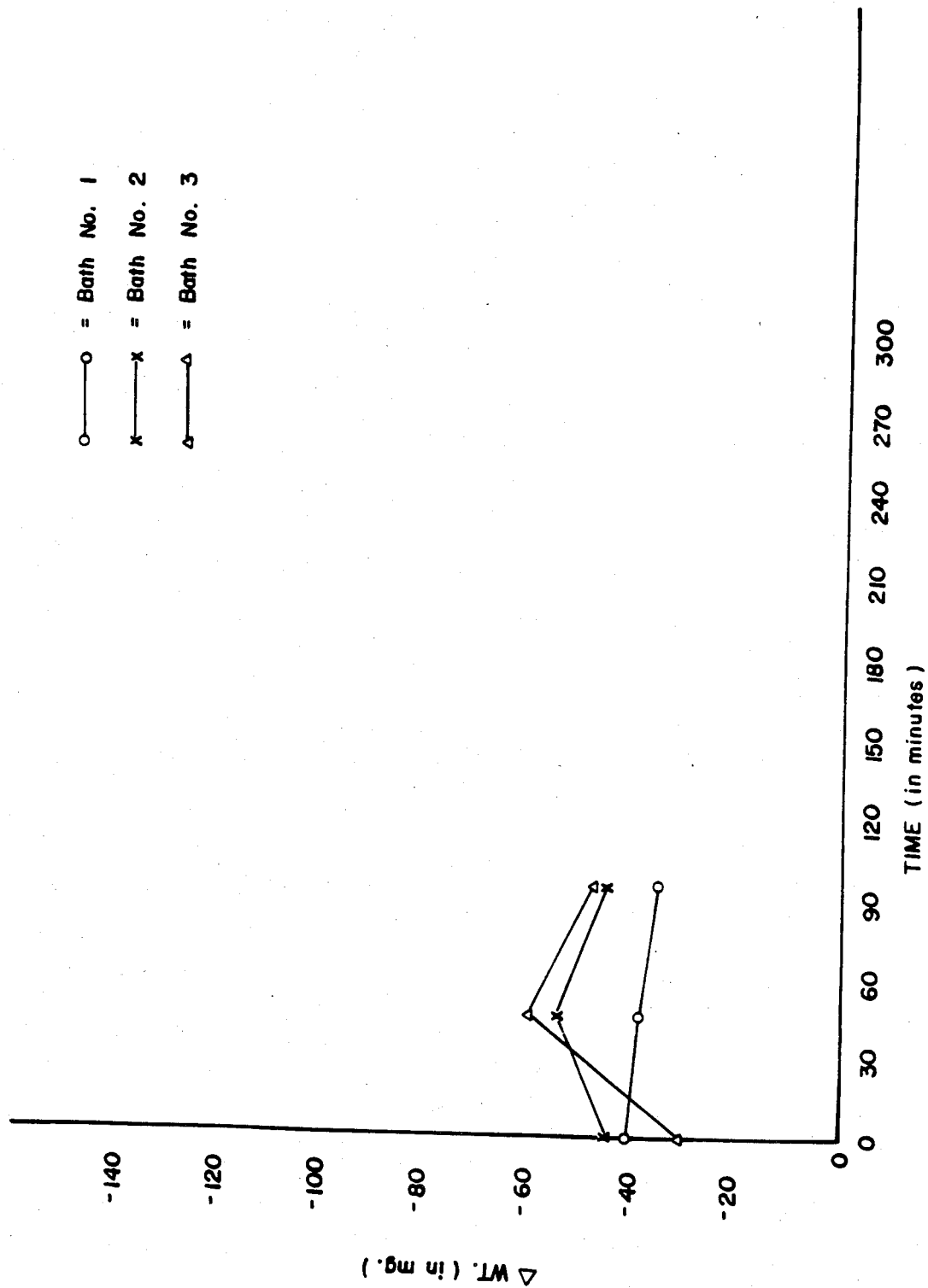
FIG. 4 is a graphical representation of the data presented in Example 7, showing $\Delta Wt$ plotted against time.

The data from Example 7 is also presented graphically in FIG. 4 where ΔWt is plotted against time.

EXAMPLE 8

| Time (in minutes) | Δ Wt (in mg.) | |
|---|---|---|
| BATH NO. 1 | | |
| 0 | −36.6 | |
| 45 | −25.7 | |
| 90 | — | average Δ Wt = −20.8 |
| 120 | −18.4 | |
| 165 | −11.4 | |
| 270 | −11.8 | |
| BATH NO. 2 | | |
| 0 | −36.6 | |
| 45 | −35.5 | |
| 90 | — | average Δ Wt = −26.5 |
| 120 | −23.9 | |
| 165 | −13.3 | |
| 270 | −23.3 | |
| BATH NO. 3 | | |
| 0 | −20.3 | |
| 45 | — | |
| 90 | — | average Δ Wt = −26.4 |
| 120 | −26.3 | |
| 165 | −27.1 | |
| 270 | −31.8 | |

Figure 5:
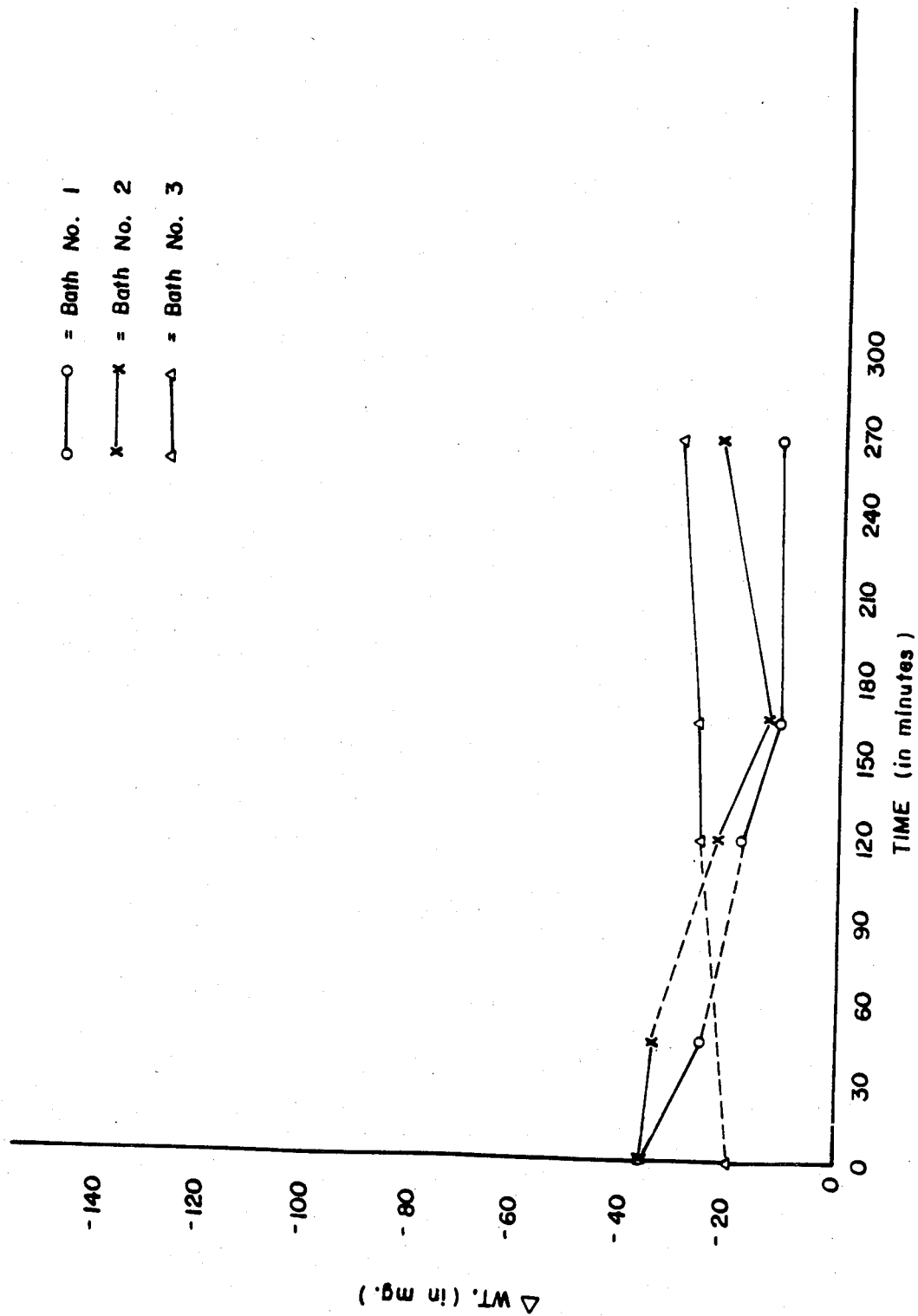
FIG. 5 is a graphical representation of the data presented in Example 8, showing $\Delta Wt$ plotted against time.

The data from Example 8 is also presented graphically in FIG. 5 where Δwt is plotted against time. The dashed portions of the graph represent the time periods where a Δwt measurement was skipped.

EXAMPLE 9

| Time (in minutes) | Δ Wt (in mg.) | |
|---|---|---|
| BATH NO. 1 | | |
| 0 | −15.0 | |
| 90 | −14.3 | average Δ Wt = −14.1 |
| 135 | −13.9 | |
| 180 | −13.1 | |
| BATH NO. 2 | | |
| 0 | −18.9 | |
| 90 | −18.4 | average Δ Wt = −17.1 |
| 135 | −16.1 | |
| 180 | −15.3 | |
| BATH NO. 3 | | |
| 0 | −23.1 | |
| 90 | −20.5 | average Δ Wt = −20.9 |
| 135 | −21.4 | |
| 180 | −18.5 | |

Figure 6:
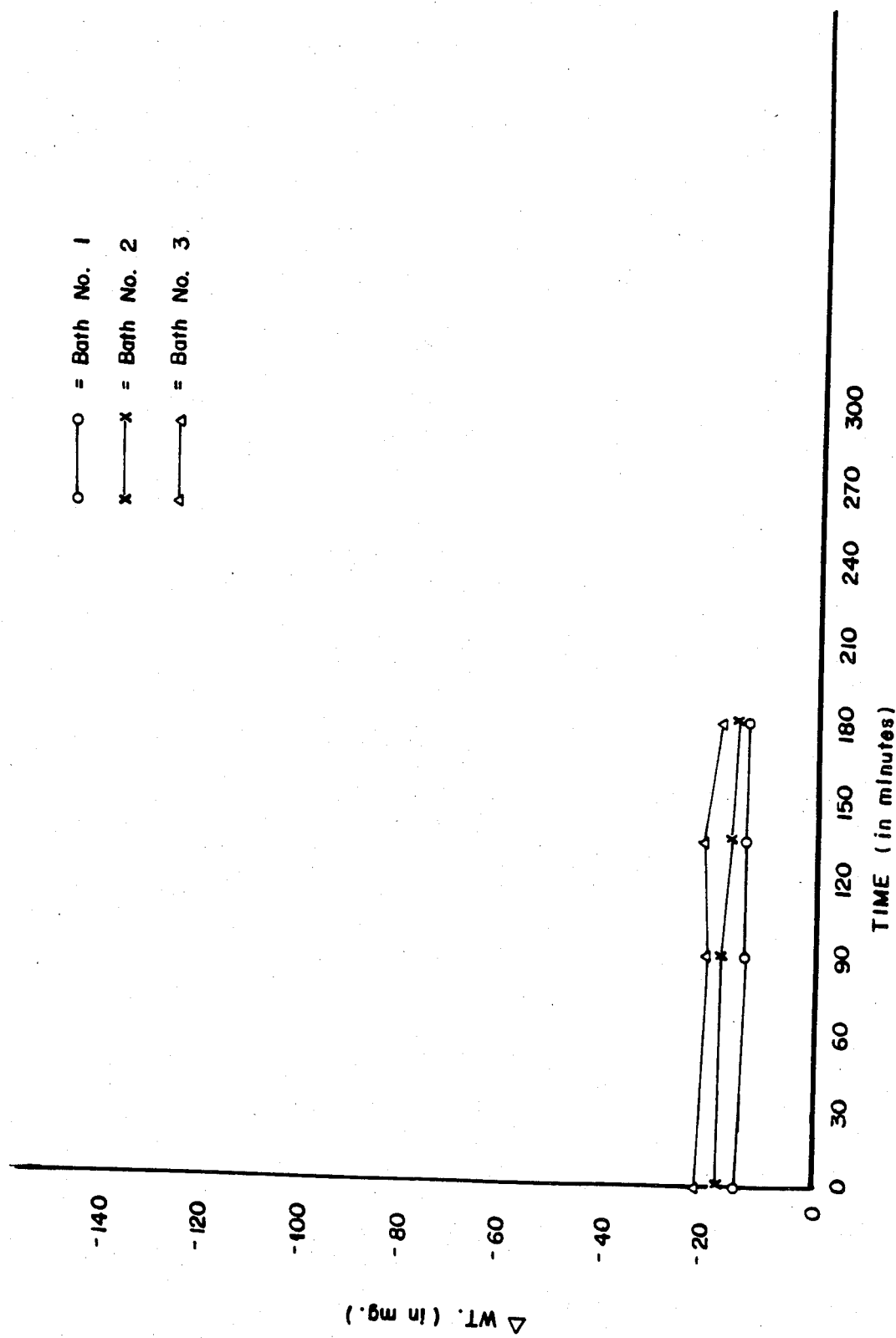
FIG. 6 is a graphical representation of the data presented in Example 9, showing $\Delta Wt$ plotted against time.

The data in Example 9 is also presented graphically in FIG. 6 where ΔWt is plotted against time.

Examples 4–9 show the regenerative effect of NaOCl on a permanganate etch bath. The useful life of the baths containing NaOCl is significantly extended compared to the same bath with no oxidizer in it (Bath No. 1). This is evidenced by the higher weight losses produced by Baths No. 2 and 3 than by Bath No. 1. These higher weight losses are possible because the NaOCl regenerates permanganate as it is depleted.

EXAMPLE 10

Sodium bromate was tested as a regenerator for spent permanganate desmearing baths by adding a solution of sodium bromate to a spent (green color) permanganate bath and observing any color change in the bath. No color change was observed, indicating that the sodium bromate solution was not effective in converting any substantial portion of the non-permanganate manganese species to permanganate.

Solid sodium bromate was then added to a bath which contained small amounts of manganate. A color change was observed from green (indicating the presence of the manganate in the bath) to purple indicating the conversion of manganate to permanganate.

Example 10 demonstrates that sodium bromate is effective in oxidizing non-permanganate manganese species to permanganate, but that the rate of oxidation is very slow.

EXAMPLE 11

Sodium chlorate ($NaClO_3$) and sodium chlorite($NaClO_2 \cdot 2H_2O$) were tested as a regenerator for permanganate baths in a manner similar to that described in Examples 4–9. Both the $NaClO_3$ and $NaClO_2$ were effective in prolonging the useful life of the baths although $NaClO_3$ was the more effective of the two.

COMPARATIVE EXAMPLE

Two aqueous solutions were prepared containing the following ingredients:

| SOLUTION A** | SOLUTION B |
|---|---|
| 25 g/l calcium hypochlorite | 100 g/l sodium chlorate |
| 40 g/l NaOH | 40 g/l NaOH |

**Not all of the material dissolved in this solution.

Solutions A and B were then each tested as etch baths using the procedure outlined in Example 4. Both solutions resulted in a weight gain, rather than a weight loss, for the boards (Solution A ΔWt = +19.8 mg; Solution B ΔWt = +18.7 mg). This demonstrates that hypochlorites and chlorates are not effective etchants and, therefore, are not contributing to the weight losses experienced in Examples 4–9 and 11. Thus, it is concluded that the weight losses in those Examples is attributable to the presence of permanganate in the baths due to the regenerative effect of the hypochlorite and chlorate in the baths.

I claim:

1. A method for regenerating the spent permanganate ions in an alkaline permanganate-containing etchant composition, said method comprising periodically adding to the composition, in an amount sufficient to oxidize essentially all of the non-permanganate manganese species in the composition to permanganate, an oxidizer selected from the group consisting of an inorganic peroxydisulfate, mixtures of an inorganic peroxydisulfate and an inorganic hypochlorite, and mixtures of an inorganic peroxydisulfate and an inorganic chlorate.

2. The method of claim 1 wherein the oxidizer is an inorganic peroxydisulfate.

3. The method of claim 1 wherein the oxidizer is a mixture of an inorganic peroxydisulfate and an inorganic hypochlorite.

4. The method of claim 1 wherein the oxidizer is a mixture of an inorganic peroxydulsulfate and an inorganic chlorate.

* * * * *